United States Patent [19]

Iwasaki et al.

[11] Patent Number: 5,882,493
[45] Date of Patent: Mar. 16, 1999

[54] HEAT TREATED AND SINTERED SPUTTERING TARGET

[75] Inventors: Hiroko Iwasaki, Tokyo; Yoshiyuki Kageyama, Yokohama; Makoto Harigaya, Hiratsuka; Masaetsu Takahashi; Hiroshi Deguchi, both of Yokohama; Katsuyuki Yamada, Mishima; Yoshitaka Hayashi, Yokohama; Yukio Ide, Mishima, all of Japan

[73] Assignee: Ricoh Company, Ltd., Tokyo, Japan

[21] Appl. No.: 946,880

[22] Filed: Oct. 8, 1997

Related U.S. Application Data

[63] Continuation of Ser. No. 354,227, Dec. 12, 1994, abandoned.

[30] Foreign Application Priority Data

Dec. 13, 1993 [JP] Japan ..................................... 5-341906
May 2, 1994 [JP] Japan ..................................... 6-116013

[51] Int. Cl.$^6$ ............................. C23C 14/14; B41M 5/26
[52] U.S. Cl. .................... 204/298.13; 148/430; 148/513; 148/514; 75/228; 75/247; 419/33
[58] Field of Search ..................... 148/513, 514, 148/430; 75/228, 247; 204/298.13; 419/33

[56] References Cited

U.S. PATENT DOCUMENTS

| 3,530,441 | 9/1970 | Ovshinsky et al. . |
| 5,100,700 | 3/1992 | Ide et al. . |
| 5,156,693 | 10/1992 | Ide et al. ................................ 148/403 |

FOREIGN PATENT DOCUMENTS

| 62-001146 | 1/1987 | Japan . |
| 62-114136 | 5/1987 | Japan . |
| 03240590 | 10/1991 | Japan . |
| 04151286 | 5/1992 | Japan . |
| 04191089 | 7/1992 | Japan . |
| 04232779 | 8/1992 | Japan . |
| 05-185732 | 7/1993 | Japan . |
| 06-028710 | 2/1994 | Japan . |
| 06-299342 | 10/1994 | Japan . |
| 06-330298 | 11/1994 | Japan . |

*Primary Examiner*—Margery Phipps
*Attorney, Agent, or Firm*—Oblon, Spivak, McClelland, Maier & Neustadt, P.C.

[57] ABSTRACT

A sputtering target, for forming a recording layer of an optical recording medium in which information is written and erased through a transition between two phases by utilizing electromagnetic wave energy, consists of a heat-treated and sintered composition represented by the formula:

$$Ag_\alpha In_\beta Te_\gamma Sb_\delta$$

wherein $$2 \leq \alpha \leq 30$$

$$3 \leq \beta \leq 30$$

$$10 \leq \gamma \leq 50$$

$$15 \leq \delta \leq 83$$

$$\alpha+\beta+\gamma+\delta=100$$

A method of producing the sputtering target, an optical recording medium having a recording layer formed through sputtering by use of the sputtering target, and a method of forming the recording layer are also disclosed.

10 Claims, 4 Drawing Sheets

HEAT TREATED AND SINTERED SPUTTERING TARGET

This application is a continuation of application Ser. No. 08/354,227 filed on Dec. 12, 1994, now abandoned.

BACKGROUND OF THE INVENTION

The present invention generally relates to a sputtering target, a method of producing the sputtering target, an optical recording medium having a recording layer formed by use of the sputtering target, and a method of forming the recording layer. More particularly, the present invention relates to a sputtering target and the production method thereof, the sputtering target being suitable for forming a recording layer through sputtering, and to a recording layer of an optical recording medium and the production method thereof, the recording layer being formed through sputtering by use of the sputtering target and comprising a phase-change optical memory material on which information is written and erased through a transition of two phases utilizing electromagnetic wave energy.

A phase-change optical memory material among various types of optical memory materials is known, and it is verified as being suitable for forming a recording layer or film of a rewritable optical disk. In the phase-change optical memory material, information is written, retrieved and erased through a transition of two phases of crystal structure conditions of the material, that is, from a crystal phase to a non-crystal or amorphous phase and vice versa, or from one crystal phase to another crystal phase and vice versa, and such a transition is caused by application of an electromagnetic wave such as laser light. Further, the phase-change optical memory material is suitable for forming a recording layer of an optical recording medium on which information stored therein is rewritable by use of a single beam.

Since it is difficult for a conventional magneto-optical memory to realize the rewritable feature mentioned above, much research and development on phase-change optical memory materials has been carried out. In addition, since the mechanism of an optical system for driving a phase-change optical memory material is simpler than the mechanism in the case of a magneto-optical memory, the phase-change optical memory materials have been found very useful.

U.S. Pat. No. 3,530,441 discloses typical examples of the phase-change optical memory materials which are chalcogen-structure alloy materials such as Ge—Te, Ge—Te—Sn, Ge—Te—S, Ge—Se—Sb, Ge—As—Se, In—Te, Se—Te, Se—As and the like.

There is another phase-change optical memory material which is a germanium-tellurium (Ge—Te) base alloy material to which gold (Au) is added as proposed in Japanese Laid-Open Patent Application No. 61-219692, for the purpose of achieving stability, high crystallization speed and the like. Similarly, to achieve stability, high crystallization speed and the like, a germanium-tellurium (Ge—Te) base alloy material to which tin (Sn) and gold (Au) is added is proposed in Japanese Laid-Open Patent Application No. 61-219692, and a germanium-tellurium (Ge—Te) base alloy material to which palladium (Pd) is added is proposed in Japanese Laid-Open Patent Application No. 61-270190.

In addition, in order to improve the writing/erasing repeatability characteristics, alloy materials which are Ge—Te—Se—Sb and Ge—Te—Sb having specified composition ratios have been proposed in Japanese Laid-Open Patent Application Nos. 62-73438 and 63-228433.

However, the conventional methods mentioned above do not completely satisfy the characteristics required for a phase-change optical recording medium on which information is rewritable. Among the problems which are still unresolved by conventional methods, the improvement of the write/erase sensitivity, the improvements of the overwrite repeatability and stability, and the improvement of the operational life of recorded and unrecorded portions of the material are significantly important. It is desirable to provide an optical recording medium having a recording layer of phase-change memory material in which the above mentioned improvements are realized.

It is known that, in order to deposit a recording layer or film of phase-change memory material on a substrate of an optical recording medium sputtering is performed using a sputtering target. However, in the prior art, there is no disclosure or teaching concerning the features of the sputtering target. That is, the prior art does not disclose or suggest what a sputtering target is suitable for forming a recording layer of phase-change memory material, which can realize the above mentioned improvements of the characteristics for the optical recording medium. Also, in the prior art, there is no disclosure or teaching how to form a recording layer through sputtering by use of the sputtering target, which can realize the above mentioned improvements of the characteristics.

SUMMARY OF THE INVENTION

Accordingly it is an object of the present invention to provide a novel and useful sputtering target for forming a recording layer in which the above described problems of insufficient characteristics of the conventional memory materials are eliminated.

Another, more specific object of the present invention is to provide a sputtering target which realizes remarkably improved characteristics of a C/N (carrier to noise) ratio, an erase ratio, a write/erase sensitivity and an overwrite repeatability of a recording layer formed through sputtering by use of the sputtering target.

Still another object of the present invention is to provide an optical recording medium having a recording layer, formed through sputtering by use of the sputtering target, which realizes remarkably improved characteristics of the C/N ratio, the erase ratio, the write/erase sensitivity and the overwrite repeatability.

A further object of the present invention is to provide a method of producing a sputtering target suitable for forming a recording layer of a phase-change optical memory material through sputtering, which realizes remarkably improved characteristics of the C/N ratio, the erase ratio, the write/erase sensitivity and the overwrite repeatability of the recording layer.

Another object of the present invention is to provide a method of forming a recording layer of an optical recording medium through sputtering by use of the sputtering target, so that the recording layer has remarkably improved characteristics of the C/N ratio, the erase ratio, the write/erase sensitivity and the overwrite repeatability.

The above mentioned object of the present invention is achieved by a sputtering target for forming a layer of a recording medium in which information is written and erased through a transition between two phases of a memory material by utilizing electromagnetic wave energy, consisting of a composition represented by the formula:

$$Ag_\alpha In_\beta Te_\gamma Sb_\delta$$

wherein $2 \leq \alpha \leq 30$
$3 \leq \beta \leq 30$
$10 \leq \gamma \leq 50$
$15 \leq \delta \leq 83$
$\alpha+\beta+\gamma+\delta=100$.

The above mentioned object of the present invention is achieved by an optical recording medium having a recording layer which is formed through sputtering by use of the above-mentioned sputtering target, the recording layer comprising a composition represented by the formula:

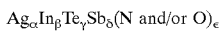

wherein
$0 \leq \alpha \leq 30$
$0 \leq \beta \leq 30$
$9 \leq \gamma \leq 50$
$9 \leq \delta \leq 80$
$0 < \epsilon \leq 5$
$\alpha+\beta+\gamma+\delta+\epsilon=100$
where $\epsilon$ Indicates a total atomic percent of nitrogen and oxygen.

The above mentioned object of the present invention is achieved by a method of producing the sputtering target, which method comprises steps of:
mixing silver, indium and tellurium;
heating the obtained mixture to a temperature above 600° C. so that the mixture is fused;
rapidly cooling the substances of the mixture so that the resulting substances contain a chalcopyrite of $AgInTe_2$;
grinding the substances into particles;
mixing the particles with silver, indium and tellurium with a simple substance of antimony; and
sintering the mixture.

The above mentioned object of the present invention is achieved by a method of forming a recording layer of an optical recording medium through sputtering by use of the above sputtering target, which method comprises steps of:
reducing a pressure of a sputtering chamber within which the sputtering target is provided, to a back pressure thereof;
providing the sputtering chamber with a first mixture gas of an argon gas and a nitrogen gas, the nitrogen gas having an initial concentration higher than or equal to 0 mol percent and lower than or equal to 15 mol percent; and
carrying out a sputtering so that a recording layer is formed on a substrate of the optical recording medium within the sputtering chamber by use of the sputtering target.

According to the present invention, the recording layer of the phase-change optical memory material on the optical recording medium can realize remarkably improved characteristics of the C/N ratio, the erase ratio, the write/erase sensitivity and the overwrite repeatability by comparison with those of the conventional memory materials.

BRIEF DESCRIPTION OF THE DRAWINGS

The other objects, features and advantages of the present invention will be more apparent from the following detailed description when read in conjunction with the accompanying drawings in which.

DESCRIPTION OF THE PREFERRED EMBODIMENTS

Figure 1:
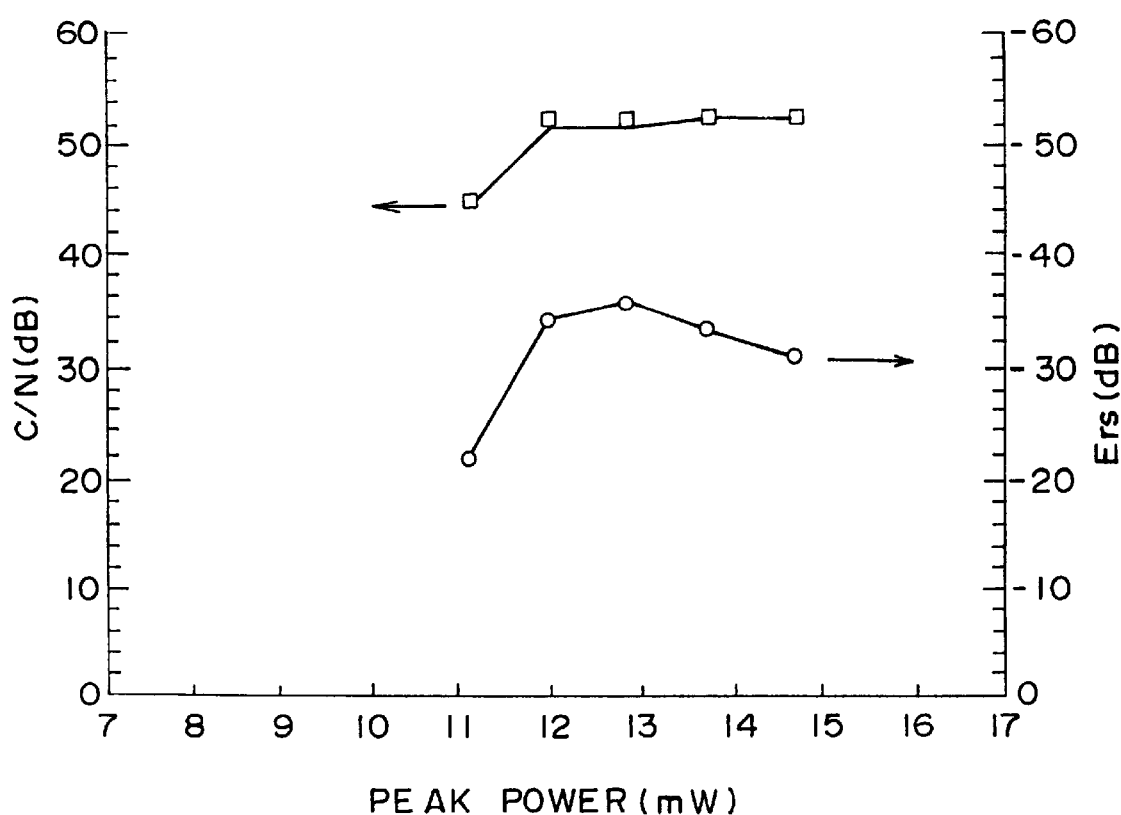
FIG. 1 is a graph showing write/erase characteristics of a recording layer of an optical disk produced from a sputtering target which is thermally treated prior to the sintering.

A description will now be given of a sputtering target and a method of producing the sputtering target according to the present invention. The sputtering target is suitable for forming a recording layer of an optical recording medium, and information thereon being written and erased through a transition of two phases of a phase-change optical memory material by utilizing electromagnetic wave energy.

A recording layer of a phase-change optical memory material having desired characteristics can be formed through sputtering by use of the sputtering target according to the present invention. When the recording layer is initialized, or when information is recorded or reproduced, various electromagnetic waves such as laser light, electron beams, X-rays, ultraviolet rays, visible light, infrared rays, microwaves and the like can be applied to the recording layer. Among those electromagnetic waves, a laser beam emitted by a semiconductor laser is most desirable for the recording reproducing and erasing of the recording layer since the semiconductor laser is small, compact and convenient for installation into a drive unit of the optical recording medium.

The sputtering target according to the present invention consists of a composition represented by the formula: $Ag_\alpha In_\beta Te_\gamma Sb_\delta$ wherein $2 \leq \alpha \leq 30$, $3 \leq \beta \leq 30$, $10 \leq \gamma 50$, $15 \leq \delta \leq 83$, and $\alpha+\beta+\gamma+\delta=100$. It is verified that an optical recording medium such as an optical disk having desired characteristics is realized by using the above sputtering target, which will be described below.

In this sputtering target, the memory material preferably contains a chalcopyrite compound of $AgInTe_2$ in combination with antimony, the chalcopyrite compound having a substantially stoichiometric composition ratio.

In this sputtering target, the chalcopyrite compound of $AgInTe_2$ preferably contains crystal grains which have a measured diameter that is smaller than or equal to 450 Å.

The method of producing the sputtering target according to the present invention comprises steps of:
mixing silver, indium and tellurium;
heating the obtained mixture to a temperature above 600° C. so that the mixture is fused;
rapidly cooling the substances of the mixture so that the resulting substances contain a chalcopyrite of $AgInTe_2$;
grinding the substances into particles;
mixing the particles with silver, indium and tellurium with a simple substance of antimony; and
sintering the mixture.

Alternatively, the production method of the sputtering target according to the present invention comprises steps of:
mixing silver, indium, tellurium and antimony;
heating the obtained mixture to a temperature above 600° C. so that the mixture is fused;

rapidly cooling the substances of the mixture so that the resulting substances contain a chalcopyrite of $AgInTe_2$ in combination with antimony;

grinding the substances into particles; and sintering the particles.

In this production method, a step of thermally annealing the mixture of the substances at a temperature below a melting point may be included prior to the sintering step. This melting point is referred to as a temperature at which a mixed phase of the mixture of the substances before the sintering are melt. The temperature of the heat treatment in the above step is preferably in the range from 200° C. to 450° C. It should be noted that the temperature in this range ensures to create the mixed phase in the recording layer by the annealing. It is verified that the optimal temperature for the heat treatment of the mixture of the substances before the sintering is approximately 350° C.

Next, a description will be given of an optical recording medium having a recording layer which is formed through sputtering by use of the above sputtering target according to the present invention.

The recording layer of the optical recording medium according to the present invention comprises a composition represented by the formula:

$$Ag_\alpha In_\beta Te_\gamma Sb_\delta$$

wherein $0 < \alpha \leq 30$ $0 < \beta \leq 30$ $10 \leq \gamma \leq 50$ $10 \leq \delta \leq 80$ $\alpha + \beta + \gamma + \delta = 100$.

Alternatively, the recording layer of the optical recording medium according to the present invention comprises a composition represented by the formula:

$$Ag_\alpha In_\beta Te_\gamma Sb_\delta (N \text{ and/or } O)_\epsilon$$

wherein $0 < \alpha \leq 30$ $0 < \beta \leq 30$ $9 \leq \gamma \leq 50$ $9 \leq \delta \leq 80$ $0 < \epsilon \leq 5$ $\alpha + \beta + \gamma + \delta + \epsilon = 100$ where $\epsilon$ indicates a total atomic percent of nitrogen and oxygen.

In the optical recording medium described above, it is preferably that the recording layer contains at least one of: a nitride having at least one among silver, indium, tellurium and antimony; an oxide having at least one among silver, indium, tellurium and antimony; and a simple substance of nitrogen.

In the optical recording medium described above, it is preferable that the recording layer has a boundary face adjacent to another layer of the recording medium, the boundary face containing at least one of: a nitride having at least one among silver, indium, tellurium and antimony; an oxide having at least one among silver, indium, tellurium and antimony; and a simple substance of nitrogen.

In the optical recording medium described above, it is preferable that the recording layer has a granular inter-facial portion and/or an inter-facial surface portion adjacent to another layer of the recording medium, the granular inter-facial portion and/or the inter-facial surface portion contain-ing at least one of: a nitride having at least one among silver, indium, tellurium and antimony; and oxide having at least one among silver, indium, tellurium and antimony; and a simple substance of nitrogen.

The method of forming the recording layer through sputtering by use of the above sputtering target according to the present invention, comprises steps of: providing a sputtering chamber with a mixture gas of an argon gas and a nitrogen gas, the nitrogen gas having an initial concentration that is higher than or equal to 0 mol percent and lower than or equal to 15 mol percent; and carrying out a sputtering so that a recording layer is deposited on a substrate of the optical recording medium within the sputtering chamber by use of the sputtering target.

The recording layer forming method described above preferably further comprises a step of setting a back pressure of the sputtering chamber prior to the sputtering step, to a pressure p that satisfies the inequalities: $3 \times 10^{-7}$ torr $\leq p \leq 5 \times 10^{-6}$ torr.

The recording layer forming method described above preferably further comprises a step of providing, after the sputtering step, the sputtering chamber with a second mixture gas of an argon gas and a nitrogen gas, the nitrogen gas of the second mixture gas having a concentration higher than the initial concentration, so that the recording layer is exposed to the second mixture gas.

As described above, the composition of the sputtering target which realizes an optical disk having desired characteristics is represented by the formula:

$$Ag_\alpha In_\beta Te_\gamma Sb_\delta$$

wherein $2 \leq \alpha \leq 30$, $3 \leq \beta \leq 30$, $10 \leq \gamma \leq 50$ $15 \leq \delta \leq 83$, and $\alpha + \beta + \gamma + \delta = 100$.

The optical disk usually includes a protective layer, a reflection layer and the like, in addition to the recording layer. Thus, in order to realize the optical characteristics of the optical disk, it is necessary that a specific composition of the memory material of the sputtering target among the range of the composition represented by the formula is determined depending on the kinds of materials of those layers and the thicknesses of those layers.

The thickness of the recording layer deposited on the optical recording medium according to the present invention ranges from 80 Å to 5000 <. The recording layer having a thickness in the range of 150 Å to 1000 Å is verified as being preferable. If the thickness of the recording layer is smaller than 80 Å, the light absorbing property becomes significantly low and the recording function is not effective. If the thickness of the recording layer is greater than 5000 Å, a speedy and uniform transition of two phases of the phase-change optical memory material by utilizing electromagnetic wave energy is very difficult to occur.

It is preferable that the composition of the sputtering target according to the present invention comprises a mixed phase of a chalcopyrite of $AgInTe_2$ in combination with Sb. It is verified that the composition of the sputtering target is likely to comprise the mixed phase when the source materials (the mixture of the respective element substances or alloys) are heated to a temperature above 700° C. so that the mixture is fused; the mixture being rapidly cooled to around a room temperature; the mixture being ground into particles; the particles being thermally annealed; the obtained particles being further ground; and finally the resulting mixture being sintered.

As described above, it is preferable that the sputtering target comprises a chalcopyrite of AgInTe$_2$ in combination with antimony, the chalcopyrite having a substantially stoichiometric composition ratio. It is also preferable that the mixture of the substances Ag, In, Te, and Sb before the sintering is thermally annealed at an appropriate temperature below the melting point. By performing the annealing, it is possible to create a mixed phase of AgSbTe$_2$ crystalline parts and InSb amorphous parts in the recording layer. When a recording layer is deposited on an optical recording medium through sputtering by use of the thus produced sputtering target, the recording layer of the optical recording medium shows a remarkably improved erase ratio characteristic and an excellent overwrite repeatability even with a low laser power.

As described above, it is preferable that the chalcopyrite compound of AgInTe$_2$ of the sputtering target contains crystal grains which have a measured diameter that is smaller than or equal to 450 Å. The diameters of the crystal grains can be measured by calculation of line widths of the main park obtained form ground particles of the sputtering target by means of an X-ray diffraction microscopy (an X-ray source of copper Cu used; about 24.1 Å in the case that X-ray wavelength is about 1.54 Å). When the calculation is performed, it is necessary to correct the line widths by using reference samples containing crystal grains with sufficiently large diameters. If the chalcopyrite compound of AgInTe$_2$ of the sputtering target contains crystal grains having a measured diameter greater than 450 Å, it is difficult to obtain a recording layer with improved write/erase characteristics and stability even when the sputtering target which is thermally treated prior to the sintering is used.

As described above, it is preferable that the method of forming the recording layer comprises a step of setting a back pressure of the sputtering chamber prior to the sputtering step, to a pressure p that satisfies the inequalities: $3 \cdot 10^{-7}$ torr $\leq p \leq 5 \times 10^{-6}$ torr. When the back pressure in this range is used, intermittent amorphous condition portions of AgInTe$_2$ and Sb or barriers are likely to take place in the memory material of the sputtering target. Thus, using the back pressure in the range makes it possible to contain the mixed phase of AgInTe$_2$ crystalline parts and InSb amorphous parts in the recording layer.

In addition, the method of forming the recording layer according to the present invention comprises a step of providing the sputtering chamber with a mixture gas of an argon gas an a nitrogen gas, the nitrogen gas having the initial concentration that is higher than or equal to 0 mol percent and lower than or equal to 15 mol percent. The composition of the deposited recording layer can be controlled by adjusting the concentration of the nitrogen gas in the mixture gas. In order to obtain an optical disk which is suitable for the required linear velocity of disk rotation, the optical disk layer structure and the usage conditions, it is necessary to use the mixture gas containing the nitrogen gas with an appropriate mol percent in the above mentioned range. The use of the mixture gas containing the nitrogen gas with an appropriate mol percent for the sputtering chamber makes it possible that the overwrite repeatability and durability of the optical disk has remarkably been improved.

EXAMPLES

Next, a description will be given of various examples of sputtering targets comprising memory materials consisting of various composition ratios of Ag, In, Te and Sb.

Table 1A shows examples 1 through 16 of sputtering targets which respectively comprise memory materials consisting of various composition ratios of Ag, In, Te and Sb when the composition ratios are in accordance with the formula:

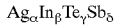

wherein
 $2 \leq \alpha \leq 30$,
 $3 \leq \beta \leq 30$,
 $10 \leq \gamma \leq 50$,
 $15 \leq \delta \leq 83$, and
 $\alpha+\beta+\gamma+\delta=100$.

Each memory material of these examples contains a chalcopyrite of AgInTe$_2$ in combination with Sb, the chalcopyrite having a substantially stoichiometric composition ratio.

The respective write/erase characteristics of optical disks produced from the examples 1–16 are also shown in Table 1A. Each optical disk is produced by use of each of the examples 1–16 in the following manner: a substrate of the optical disk on which grooves about 0.6 μm in width and about 600 Å in depth are formed is prepared; a lower protective layer (ZnS/SiO$_2$, 2000 Å), the recording layer, an upper protective layer (ZnS/SiO$_2$, 300 Å), a reflection layer (aluminum alloy, 1000 Å), and a top protective layer (ultraviolet setting type resin, 5μ) are formed with the optical disk; and the recording layer is formed through sputtering by use of a corresponding sputtering target. Each optical disk has a recording layer formed through sputtering by use of each of the examples 1–16, and the sputtering conditions for each of the examples 1–16 are: the back pressure of the sputtering chamber is set to $9 \times 10^{-7}$ torr; the pressure of the sputtering chamber after the inclusion of argon gas is set to $4 \times 10^{-7}$ torr; the sputtering is carried out by use of RF power 40 watt. The write characteristic (carrier to noise ratio "C/N") of each optical disk when a mark about 1 μm in length is written is obtained under the condition in which the optical disk is rotated at an optimal linear speed, a semiconductor laser for emitting a laser beam whose wavelength is 780 μnm, and an objective lens of NA=0.5 are used. The erase characteristic (erase ratio "Ers") of each optical disk when a mark about 3 μm in length is overwritten is obtained under the same condition.

Table 1B shows comparative examples 1 through 8 of sputtering targets comprising memory materials consisting of various composition ratios of Ag, In, Te and Sb when the composition ratios are not in accordance with the formula described above, and the respective write/erase characteristics of optical disks produced from the comparative examples.

The rating of the write/erase characteristics of the optical disks produced from the examples in Tables 1A and 1B is as follows: "1" denotes poor write/;erase characteristics (C/N<45 dB, Ers>−25 dB), "2" denotes good write/erase characteristics (45 dB$\leq$C/N<55 dB, −35 dB<Ers$\leq$−25 dB), and "3" denotes very good write/erase characteristics (C/N$\geq$55 dB, Ers$\leq$−35 dB).

From the results in Tables 1A and 1B, it can be concluded that the desired write/erase characteristics of optical disks are obtained when the memory materials of the sputtering target has a composition represented by the formula:

wherein
 $2 \leq \alpha \leq 30$,
 $3 \leq \beta \leq 30$, $10 \leq \gamma \leq 50$, $15 \leq \delta \leq 83$, and $\alpha+\beta+\gamma+\delta=100$.

TABLE 1A (EXAMPLES 1–16)

| | Ag (at. %) | In (at. %) | Te (at. %) | Sb (at. %) | RATING |
|---|---|---|---|---|---|
| SPUTTERING TARGET | | | | | |
| EX 1 | 4.0 | 15.0 | 25.0 | 56.0 | 2 |
| EX 2 | 6.0 | 8.0 | 10.0 | 76.0 | 2 |
| EX 3 | 7.0 | 11.0 | 22.0 | 60.0 | 3 |
| EX 4 | 8.0 | 27.0 | 20.0 | 45.0 | 2 |
| EX 5 | 10.0 | 15.0 | 28.0 | 47.0 | 3 |
| EX 6 | 11.0 | 11.0 | 22.0 | 56.0 | 3 |
| EX 7 | 12.5 | 12.0 | 44.0 | 31.5 | 2 |
| EX 8 | 12.5 | 12.5 | 25.0 | 50.0 | 3 |
| Ex 9 | 12.5 | 15.0 | 37.5 | 35.0 | 3 |
| EX 10 | 12.5 | 15.0 | 40.0 | 32.5 | 3 |
| EX 11 | 13.0 | 15.0 | 35.0 | 37.0 | 3 |
| EX 12 | 15.0 | 15.0 | 30.0 | 40.0 | 3 |
| EX 13 | 18.0 | 22.0 | 39.0 | 21.0 | 2 |
| EX 14 | 20.0 | 5.0 | 23.0 | 52.0 | 2 |
| EX 15 | 22.0 | 21.0 | 14.0 | 43.0 | 2 |
| EX 16 | 27.0 | 23.0 | 30.0 | 20.0 | 2 |
| RECORDING LAYER | | | | | |
| EX 1 | 2.0 | 13.0 | 24.0 | 61.01 | 2 |
| EX 2 | 4.0 | 5.0 | 11.0 | 80.0 | 2 |
| EX 3 | 5.5 | 9.0 | 21.0 | 64.5 | 3 |
| EX 4 | 5.0 | 29.0 | 16.0 | 50.0 | 2 |
| EX 5 | 7.0 | 13.0 | 26.0 | 54.0 | 3 |
| EX 6 | 8.0 | 9.0 | 21.0 | 62.0 | 3 |
| EX 7 | 9.0 | 13.0 | 46.0 | 32.0 | 2 |
| EX 8 | 9.0 | 10.0 | 34.0 | 57.0 | 3 |
| EX 9 | 9.0 | 13.0 | 25.0 | 53.0 | 3 |
| EX 10 | 9.0 | 13.0 | 37.0 | 41.0 | 3 |
| EX 11 | 10.0 | 13.0 | 32.0 | 45.0 | 3 |
| EX 12 | 12.0 | 13.0 | 28.0 | 47.0 | 3 |
| EX 13 | 13.0 | 25.0 | 42.0 | 20.0 | 3 |
| EX 14 | 20.0 | 2.0 | 21.0 | 57.0 | 3 |
| EX 15 | 25.0 | 19.0 | 15.0 | 41.0 | 2 |
| EX 16 | 28.0 | 26.0 | 34.0 | 12.0 | 2 |

DISK CHARACTERISTIC RATING:
1 = poor (C/N < 45 dB, Ers > −25 dB)
2 = good (45 dB ≤ C/N < 55 dB, −35 dB < Ers ≤ −25 dB
3 = very good (C/N ≥ 55 dB, Ers ≤ −35 dB)

TABLE 1B (EXAMPLES 1–8)

| | Ag (at. %) | In (at. %) | Te (at. %) | Sb (at. %) | RATING |
|---|---|---|---|---|---|
| SPUTTERING TARGET | | | | | |
| C/EX 1 | 1.0 | 10.0 | 15.0 | 74.0 | 1 |
| C/EX 2 | 2.0 | 3.0 | 10.0 | 85.0 | 1 |
| C/EX 3 | 8.0 | 20.0 | 55.0 | 17.0 | 1 |
| C/EX 4 | 10.0 | 1.0 | 40.0 | 49.0 | 1 |
| C/EX 5 | 12.0 | 40.0 | 30.0 | 18.0 | 1 |
| C/EX 6 | 15.0 | 6.0 | 5.0 | 74.0 | 1 |
| C/EX 7 | 27.0 | 23.0 | 40.0 | 10.0 | 1 |
| C/EX 8 | 34.0 | 8.0 | 40.0 | 18.0 | 1 |
| RECORDING LAYER | | | | | |
| C/EX 1 | 0.5 | 4.0 | 13.0 | 82.5 | 1 |
| C/EX 2 | 0.1 | 4.0 | 8.0 | 87.9 | 1 |
| C/EX 3 | 11.0 | 17.0 | 63.0 | 9.0 | 1 |
| C/EX 4 | 7.0 | 0.1 | 37.0 | 55.9 | 1 |
| C/EX 5 | 6.0 | 43.0 | 26.0 | 25.0 | 1 |
| C/EX 6 | 13.0 | 5.0 | 4.0 | 78.0 | 1 |

TABLE 1B-continued (EXAMPLES 1–8)

| | Ag (at. %) | In (at. %) | Te (at. %) | Sb (at. %) | RATING |
|---|---|---|---|---|---|
| C/EX 7 | 20.0 | 31.0 | 45.0 | 4.0 | 1 |
| C/EX 8 | 32.0 | 5.0 | 35.0 | 28.0 | 1 |

DISK CHARACTERISTIC RATING:
1 = poor (C/N < 45 dB, Ers > −25 dB)
2 = good (45 dB ≤ C/N < 55 dB, −35 dB < Ers ≤ −25 dB
3 = very good (C/N ≥ 55 dB, Ers ≤ −35 dB)

TABLE 2

(EXAMPLE 3)

| $N_2$ mol % ($N_2/(Ar + N_2)$) | REPEATABILITY |
|---|---|
| 0 | 200,000 |
| 6 | 800,000 |
| 15 | 600,000 |
| 20 | 10,000 |

| RECORDING LAYER COMPOSITION | | | | | |
|---|---|---|---|---|---|
| $N_2$ mol % | Ag (at. %) | In (at. %) | Te (at. %) | Sb (at. %) | N (at. %) |
| 0 | 5.5 | 9.0 | 21.0 | 64.5 | 0 |
| 6 | 5.4 | 8.8 | 20.6 | 63.3 | 2.0 |
| 15 | 5.2 | 8.6 | 20.0 | 61.3 | 5.0 |
| 20 | 5.1 | 8.4 | 19.5 | 60.0 | 7.0 |

Table 2 shows the overwrite repeatability characteristics of recording layers of optical disks which are formed through sputtering by use of the sputtering target of the above example 3 when the sputtering chamber is, prior to the sputtering, filled with various mixture gases having different concentrations (0, 6, 15 and 20 mol percents) of the nitrogen gas. The evaluation of the overwrite repeatability is performed under the recording conditions suitable for the optical disks. The number of overwrite operations in which an about 1 µm long mark and an about 3 µm long mark are overwritten to the optical disk for each operation is counted.

From the results in Table 2, it can be concluded that the overwrite repeatability characteristics of the optical disks sharply fall when the mixture gas containing the nitrogen gas whose concentration exceeds 15 mol percent is used during the sputtering.

Examples 17 and 18

Example 17 is a sputtering target produced from a source material which has the same composition as the above example 5. In a case of the example 17, the source material is fused, rapidly cooled, ground, thermally treated, and sintered, so that the sputtering target of the example 17 is produced. Example 18 is a sputtering target produced from the same source material (the above example 5) as the comparative purpose. In a case of the example 18, the source material is fused, rapidly cooled, ground, and sintered, but is not thermally treated prior to the sintering.

Figure 2:
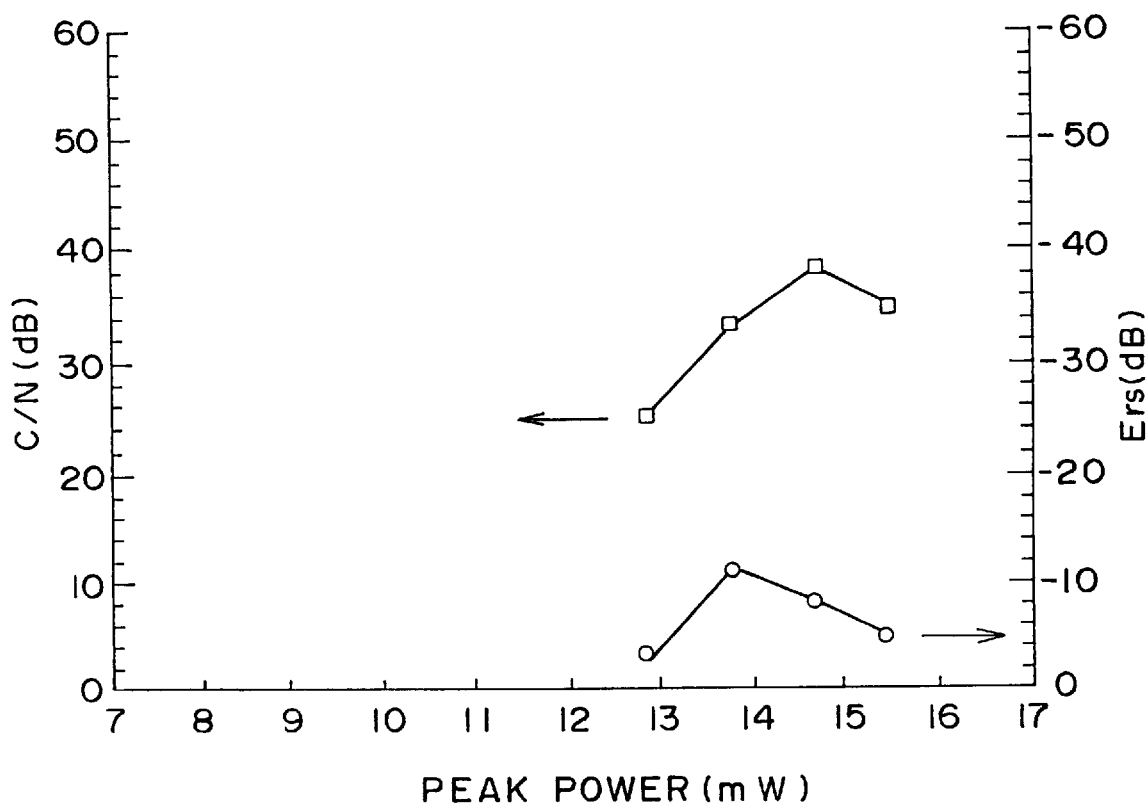
FIG. 2 is a graph showing write/erase characteristics of a recording layer of an optical disk produced from a sputtering target which is not thermally treated prior to the sintering.

FIG. 1 shows the write/erase characteristics of a recording layer of an optical disk produced from the example 17, and FIG. 2 shows the write/erase characteristics of a recording layer of an optical disk produced from the example 18. In FIGS. 1 and 2, the write/erase characteristics of each optical disk are obtained under the conditions in which the optical disk is rotated at the linear speed of 5 m/s. As the result, it can be concluded that the optical disk produced from the sputtering target which is thermally treated prior to the sintering have more desirable write/erase characteristics and sensitivities.

Examples 19 and 20

Example 19 is a sputtering target produced from a source material which has the same composition as the above example 9. The sputtering target (the chalcopyrite compound of AgInTe$_2$) of the example 19 contains crystal grains having a measured diameter that is smaller than or equal to 450 Å. Example 20 is a sputtering target produced from the same source material (the above example 9) for the comparison purpose. The sputtering target of the example 20 contains crystal grains having a measured diameter greater than 450 Å, for example, about 500 Å.

Figure 3:
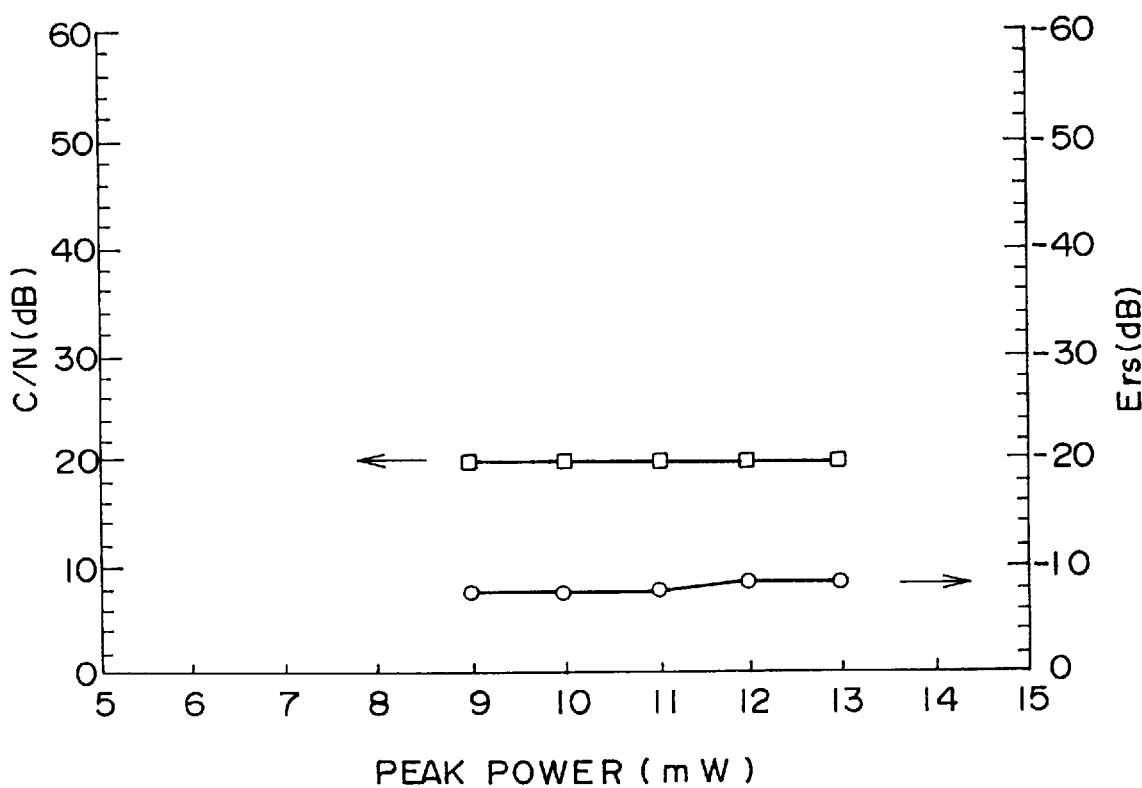
FIG. 3 is a graph showing write/erase characteristics of a recording layer of an optical disk produced from a sputtering target which contains crystal grains having a measured diameter greater than 450 Å.

FIG. 3 shows write/erase characteristics of a recording layer of an optical disk produced from the example 20. In FIG. 3, the write/erase characteristics of the optical disk are obtained under the conditions in which the optical disk is rotated at the linear speed of 2 m/s. As the result, it can be concluded that the optical disk produced from the sputtering target containing crystal grains having a measured diameter that is smaller than or equal to 450 Å has more desirable write/erase characteristics.

Examples 21 and 22

Example 21 is a sputtering target produced from a source material which has the same composition as the above example 5, and this sputtering target is produced by heating the source material to a temperature above 600° C. so that the source material is fused. Example 22 is a sputtering target produced from the same source material for the comparison purpose, and this sputtering target is produced by heating the source material to 500° C. Optical disks are produced from these sputtering targets, and the write/erase characteristics of these optical disks are compared with each other. As the result, the optical disk produced form the example 21 has more desirable write/erase characteristics.

Figure 4:
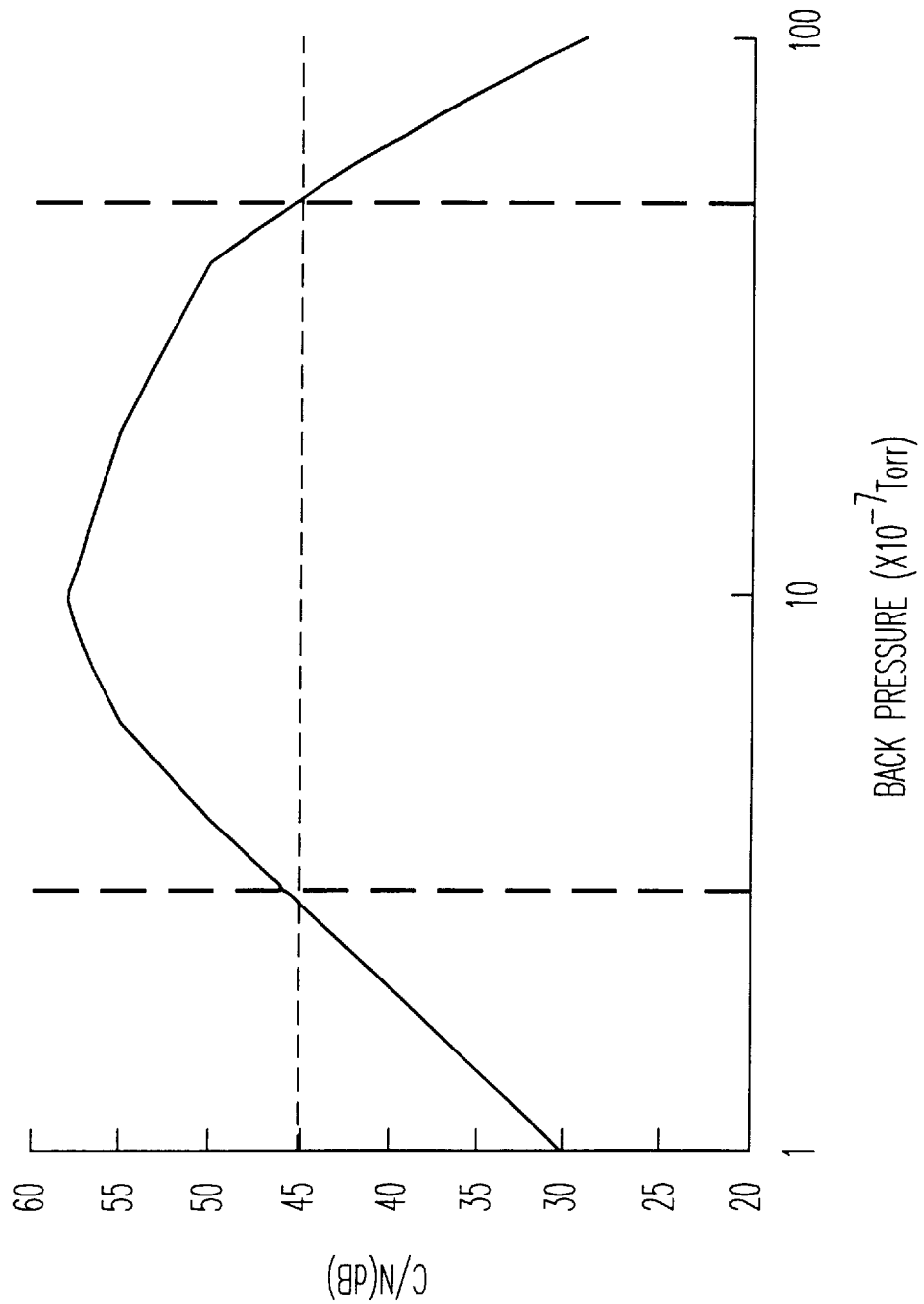
FIG. 4 is a graph showing a relationship between the back pressure and the write/erase characteristics of a recording layer formed through sputtering by use of a sputtering target.

In addition, FIG. 4 shows a relationship between the back pressure of the sputtering chamber and the write/erase characteristics (C/N ratio) of a recording layer formed through sputtering by use of the sputtering target of the above example 3. In FIG. 4, only the back pressure is varied, and the other sputtering conditions, the recording layer structure and the disk characteristic rating are the same as those of the above example 3. FIG. 4 indicates that the recording layer has good write/erase characteristics (C/N ratio) when the sputtering is carried out by setting the back pressure of the sputtering chamber to a pressure p that satisfies the inequalities: $3 \times 10^{-7}$ torr $\leq p \leq 5 \times 10^{-6}$ torr.

Further, the present invention is not limited to the above described embodiments, and variations and modifications may be made without departing from the scope of the present invention.

What is claimed is:

1. A sputtering target for forming a layer of a recording medium in which information is written and erased through a transition between two phases of a memory material by utilizing electromagnetic wave energy, consisting of a heat-treated and sintered composition represented by the formula:

$$Ag_\alpha In_\beta Te_\gamma Sb_\delta$$

wherein
$2 \leq \alpha \leq 30$
$3 \leq \beta \leq 30$
$10 \leq \gamma \leq 50$
$15 \leq \delta \leq 83$
$\alpha + \beta + \gamma + \delta = 100$.

2. The sputtering target as claimed in claim 1, wherein said heat-treated and sintered composition of the sputtering target comprises a chalcopyrite of AgInTe$_2$ in combination with antimony, the chalcopyrite having a substantially stoichiometric composition ratio.

3. The sputtering target as claimed in claim 2, wherein said chalcopyrite of AgInTe$_2$ is crystallite of which diameter is smaller than or equal to 450 Å.

4. A method of producing a sputtering target, comprising steps of:

mixing silver, indium and tellurium;

heating the obtained mixture to a temperature above 600° C. so that the mixture is fused;

rapidly cooling the substances of said mixture so that the resulting substances contain a chalcopyrite of AgInTe$_2$;

grinding the substances into particles;

mixing said particles with silver, indium and tellurium with a simple substance of antimony; and sintering the mixture to obtain a sputtering target consisting of a heat-treated and sintered composition represented by the formula:

$$Ag_\alpha In_\beta Te_\gamma Sb_\delta$$

wherein
$2 \leq \alpha \leq 30$
$3 \leq \beta \leq 30$
$10 \leq \gamma \leq 50$
$15 \leq \delta \leq 83$
$\alpha + \beta + \gamma + \delta = 100$.

5. The method according to claim 4, further comprising the step of:

thermally annealing, prior to said sintering step, the mixture at a temperature below a melting point.

6. A method of producing a sputtering target, comprising steps of:

mixing silver, indium ,tellurium and antimony;

heating the obtained mixture to a temperature above 600° C. so that the mixture is fused;

rapidly cooling the substances of said mixture so that the resulting substances contain a chalcopyrite of AgInTe$_2$ in combination with antimony;

grinding the substances into particles; and sintering said particles to obtain a sputtering target consisting of a heat-treated and sintered composition represented by the formula:

$$Ag_\alpha In_\beta Te_\gamma Sb_\delta$$

wherein
$2 \leq \alpha \leq 30$
$3 \leq \beta \leq 30$
$10 \leq \gamma \leq 50$
$15 \leq \delta \leq 83$
$\alpha + \beta + \gamma + \delta = 100$.

7. The method according to claim 6, further comprising a step of:

thermally annealing, prior to said sintering step, the mixture at a temperature below a melting point.

8. A method of forming a recording layer of an optical recording medium through sputtering by use of the sputtering target according to claim 1, comprising steps of:

reducing a pressure of a sputtering chamber within which the sputtering target is provided, to a back pressure thereof;

providing said sputtering chamber with a first mixture gas of an argon and a nitrogen gas, the nitrogen gas having an initial concentration higher than or equal to 0 mol percent and lower than or equal to 15 mol percent; and carrying out a sputtering so that a recording layer is deposited on a substrate of the optical recording medium within the sputtering chamber by use of the sputtering target.

9. The method according to claim 8, further comprising the step of:

setting said back pressure of the sputtering chamber prior to the sputtering, to a pressure p that satisfies the inequalities:

$3 \times 10^{-7}$ torr $\leq p \leq 5 \times 10^{-6}$ torr.

10. The method according to claim 8, further comprising a step of:

providing, after the sputtering step, the sputtering chamber with a second mixture gas of an argon gas and a nitrogen gas, the nitrogen gas of the second mixture gas having a concentration higher than a concentration of the nitrogen gas in the first mixture gas during the sputtering, so that the recording layer is exposed to said second mixture gas.

* * * * *

UNITED STATES PATENT AND TRADEMARK OFFICE
CERTIFICATE OF CORRECTION

PATENT NO.   : 5,882,493
DATED        : March 16, 1999
INVENTOR(S)  : Hiroko Iwasaki et al.

It is certified that error appears in the above-identified patent and that said Letters Patent is hereby corrected as shown below:

<u>Columns 19, 20, 21, and 22,</u>
Should be deleted, and substitute therefor correctly numbered columns 11, 12, 13, and 14, as shown on the attached pages.

Signed and Sealed this

Eleventh Day of February, 2003

JAMES E. ROGAN
*Director of the United States Patent and Trademark Office*

Examples 19 and 20

Example 19 is a sputtering target produced from a source material which has the same composition as the above example 9. The sputtering target (the chalcopyrite compound of $AgInTe_2$) of the example 19 contains crystal grains having a measured diameter that is smaller than or equal to 450 Å. Example 20 is a sputtering target produced from the same source material (the above example 9) for the comparison purpose. The sputtering target of the example 20 contains crystal grains having a measured diameter greater than 450 Å, for example, about 500 Å.

FIG. 3 shows write/erase characteristics of a recording layer of an optical disk produced from the example 20. In FIG. 3, the write/erase characteristics of the optical disk are obtained under the conditions in which the optical disk is rotated at the linear speed of 2 m/s. As the result, it can be concluded that the optical disk produced from the sputtering target containing crystal grains having a measured diameter that is smaller than or equal to 450 Å has more desirable write/erase characteristics.

Examples 21 and 22

Example 21 is a sputtering target produced from a source material which has the same composition as the above example 5, and this sputtering target is produced by heating the source material to a temperature above 600° C. so that the source material is fused. Example 22 is a sputtering target produced from the same source material for the comparison purpose, and this sputtering target is produced by heating the source material to 500° C. Optical disks are produced from these sputtering targets, and the write/erase characteristics of these optical disks are compared with each other. As the result, the optical disk produced form the example 21 has more desirable write/erase characteristics.

In addition, FIG. 4 shows a relationship between the back pressure of the sputtering chamber and the write/erase characteristics (C/N ratio) of a recording layer formed through sputtering by use of the sputtering target of the above example 3. In FIG. 4, only the back pressure is varied, and the other sputtering conditions, the recording layer structure and the disk characteristic rating are the same as those of the above example 3. FIG. 4 indicates that the recording layer has good write/erase characteristics (C/N ratio) when the sputtering is carried out by setting the back pressure of the sputtering chamber to a pressure p that satisfies the inequalities: $3 \times 10^{-7}$ torr $\leq p \leq 5 \times 10^{-6}$ torr.

Further, the present invention is not limited to the above described embodiments, and variations and modifications may be made without departing from the scope of the present invention.

What is claimed is:

1. A sputtering target for forming a layer of a recording medium in which information is written and erased through a transition between two phases of a memory material by utilizing electromagnetic wave energy, consisting of a heat-treated and sintered composition represented by the formula:

$$Ag_\alpha In_\beta Te_\gamma Sb_\delta$$

wherein $2 \leq \alpha \leq 30$ $3 \leq \beta \leq 30$ $10 \leq \gamma \leq 50$ $15 \leq \delta \leq 83$ $\alpha + \beta + \gamma + \delta = 100$.

2. The sputtering target as claimed in claim 1, wherein said heat-treated and sintered composition of the sputtering target comprises a chalcopyrite of $AgInTe_2$ in combination with antimony, the chalcopyrite having a substantially stoichiometric composition ratio.

3. The sputtering target as claimed in claim 2, wherein said chalcopyrite of $AgInTe_2$ is crystallite of which diameter is smaller than or equal to 450 Å.

4. A method of producing a sputtering target, comprising steps of:

mixing silver, indium and tellurium;

heating the obtained mixture to a temperature above 600° C. so that the mixture is fused;

rapidly cooling the substances of said mixture so that the resulting substances contain a chalcopyrite of $AgInTe_2$;

grinding the substances into particles;

mixing said particles with silver, indium and tellurium with a simple substance of antimony; and sintering the mixture to obtain a sputtering target consisting of a heat-treated and sintered composition represented by the formula:

$$Ag_\alpha In_\beta Te_\gamma Sb_\delta$$

wherein $2 \leq \alpha \leq 30$ $3 \leq \beta \leq 30$ $10 \leq \gamma \leq 50$ $15 \leq \delta \leq 83$ $\alpha + \beta + \gamma + \delta = 100$.

5. The method according to claim 4, further comprising the step of:

thermally annealing, prior to said sintering step, the mixture at a temperature below a melting point.

6. A method of producing a sputtering target, comprising steps of:

mixing silver, indium ,tellurium and antimony;

heating the obtained mixture to a temperature above 600° C. so that the mixture is fused;

rapidly cooling the substances of said mixture so that the resulting substances contain a chalcopyrite of $AgInTe_2$ in combination with antimony;

grinding the substances into particles; and sintering said particles to obtain a sputtering target consisting of a heat-treated and sintered composition represented by the formula:

$$Ag_\alpha In_\beta Te_\gamma Sb_\delta$$

wherein $2 \leq \alpha \leq 30$ $3 \leq \beta \leq 30$ $10 \leq \gamma \leq 50$ $15 \leq \delta \leq 83$ $\alpha + \beta + \gamma + \delta = 100$.

7. The method according to claim 6, further comprising a step of:

thermally annealing, prior to said sintering step, the mixture at a temperature below a melting point.

8. A method of forming a recording layer of an optical recording medium through sputtering by use of the sputtering target according to claim 1, comprising steps of:

reducing a pressure of a sputtering chamber within which the sputtering target is provided, to a back pressure thereof;

providing said sputtering chamber with a first mixture gas of an argon and a nitrogen gas, the nitrogen gas having an initial concentration higher than or equal to 0 mol percent and lower than or equal to 15 mol percent; and carrying out a sputtering so that a recording layer is deposited on a substrate of the optical recording medium within the sputtering chamber by use of the sputtering target.

9. The method according to claim 8, further comprising the step of:

setting said back pressure of the sputtering chamber prior to the sputtering, to a pressure p that satisfies the inequalities:

$3 \times 10^{-7}$ torr $\leq p \leq 5 \times 10^{-6}$ torr.

10. The method according to claim 8, further comprising a step of:

providing, after the sputtering step, the sputtering chamber with a second mixture gas of an argon gas and a nitrogen gas, the nitrogen gas of the second mixture gas having a concentration higher than a concentration of the nitrogen gas in the first mixture gas during the sputtering, so that the recording layer is exposed to said second mixture gas.

* * * * *